US006985367B1

(12) United States Patent
Scigiel

(10) Patent No.: US 6,985,367 B1
(45) Date of Patent: Jan. 10, 2006

(54) CIRCUIT BOARD RETAINER AND SUPPORT APPARATUS

(75) Inventor: Brian J. Scigiel, Southgate, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 10/963,089

(22) Filed: Oct. 12, 2004

(51) Int. Cl.
*H05K 7/14* (2006.01)
*H05K 7/18* (2006.01)

(52) U.S. Cl. ...................... 361/801; 361/803; 361/758; 361/790; 174/138 D; 174/138 G

(58) Field of Classification Search ................ 361/801, 361/790, 742, 758, 770, 804, 735, 803; 257/686; 174/138 D, 138 G; 439/76.1
See application file for complete search history.

(56) References Cited

U.S. PATENT DOCUMENTS 5,452,184 A * 9/1995 Scholder et al. ............ 361/799
5,796,593 A * 8/1998 Mills et al. ................. 341/801
6,201,709 B1 * 3/2001 Justiniano et al. .......... 361/790
2002/0070657 A1 6/2002 Park

* cited by examiner

*Primary Examiner*—Kamand Cuneo
*Assistant Examiner*—Hung S. Bui
(74) *Attorney, Agent, or Firm*—MacMillan, Sobanski & Todd, LLC

(57) ABSTRACT

A circuit board retainer and support apparatus has a first board including a first side and an opposed second side. It also has a first multi-board clip extending from the first side, with the first multi-board clip including a first short spacer block having a short support surface located a first height above the first side, a first long spacer block having a long support surface located a second height above the first side, and a first securing flange, having a first barb with an engagement surface that is a third height above the first side. Also, the first long spacer block is located adjacent to the first securing flange and the first short spacer block is located adjacent to the first long spacer block and farther from the first securing flange than the first long spacer block. The first multi-board clip may also include a second barb extending from the securing flange in an opposed direction from the first and a second securing flange and barb extending from the second side of the first board. With such a circuit board retainer and support apparatus, multiple circuit boards may be retained in spaced relation to each other.

19 Claims, 3 Drawing Sheets

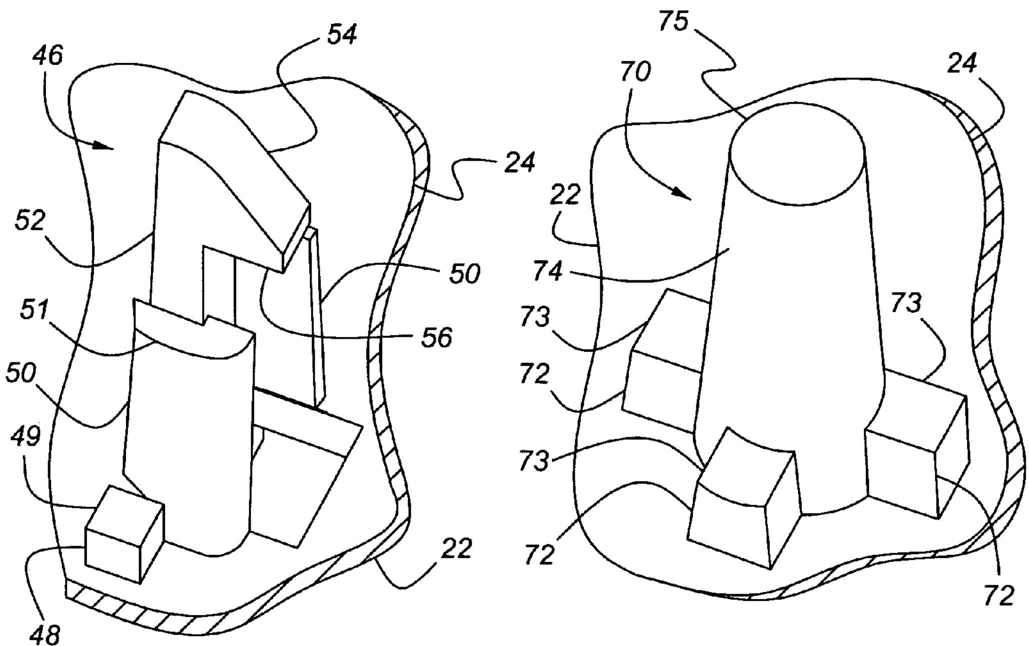
Fig. 3
Fig. 4
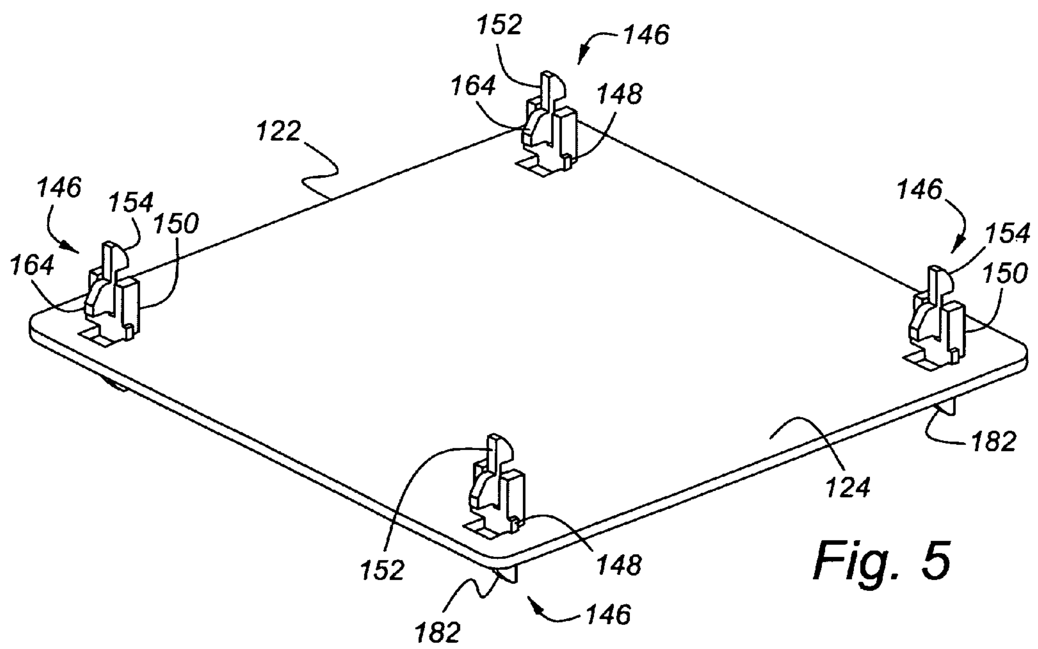
Fig. 5

CIRCUIT BOARD RETAINER AND SUPPORT APPARATUS

BACKGROUND OF INVENTION

The present invention relates to circuit board assemblies, and in particular to circuit board assemblies with the circuit boards supported and retained in spaced relation to each other.

Often times it is desirable to retain printed circuit boards in spaced relation to one another. Typically, edge retainers and supports, which may be clips with spacers, secure two boards in spaced related to each other. But if a third and/or a fourth printed circuit board are also desired to be secured in spaced relation to the first two, a separate set of clips is employed, on the second board, third board, and/or the fourth board. Such arrangements may tend to overly complicate the assembly procedure, take more assembly time than is desired, and increase the overall cost.

Thus, it is desirable to secure multiple circuit boards in spaced relation to each other while overcoming the drawbacks of the prior art.

SUMMARY OF INVENTION

In its embodiments, the present invention contemplates a circuit board retainer and support apparatus. The circuit board retainer and support apparatus may comprise a first board including a first side and an opposed second side. It may also include a first multi-board clip extending from the first side, with the first multi-board clip including a first short spacer block having a short support surface located a first height above the first side, a first long spacer block having a long support surface located a second height above the first side that is greater than the first height, and a first securing flange, having a first barb with an engagement surface that is a third height above the first side that is greater than the second height, and with the first long spacer block being located adjacent to the first securing flange and the first short spacer block being located adjacent to the first long spacer block and farther from the first securing flange than the first long spacer block.

The present invention also contemplates a circuit board assembly. The circuit board assembly may comprise a first board including a first side and an opposed second side; and a first multi-board clip extending from the first side, with the first multi-board clip including a first short spacer block having a short support surface located a first height above the first side, a first long spacer block having a long support surface located a second height above the first side that is greater than the first height, and a first securing flange, having a first barb with an engagement surface that is a third height above the first side that is greater than the second height, and with the first long spacer block being located adjacent to the first securing flange and the first short spacer block being located adjacent to the first long spacer block and farther from the first securing flange than the first long spacer block. The circuit board assembly may also comprise a first circuit board including a first side, an opposed second side that faces the first side of the first board, and a mounting hole sized to receive the first long spacer block and the first securing flange therethrough while not receiving the first short spacer block therethrough such that the second side of the first circuit board contacts the short support surface; and a second circuit board including a first side, an opposed second side that faces the first side of the first circuit board and contacts the long support surface, and a mounting edge engaged with the engagement surface of the first barb.

An advantage of an embodiment of the present invention is that the multi-board clips can retain and space apart three boards. These boards can be high or low current circuit boards or a combination of high and low current circuit boards.

A further advantage of an embodiment of the present invention is that the multi-board clips can retain and space apart four boards. These boards can be high or low current circuit boards or a combination of high and low current circuit boards.

An additional advantage of an embodiment of the present invention is that the assembly complexity, time and cost may be less than the prior art board assemblies employing separate clips to maintain the different layers in spaced relation to each other.

Another advantage of an embodiment of the present invention is that the multi-board clips can also be employed with more conventional two board clips in order to be able to retain and space apart additional boards.

BRIEF DESCRIPTION OF DRAWINGS

FIG. 3 is a perspective view of a multi-board clip extending from an insulator board in accordance with the first embodiment of the present invention.

FIG. 4 is a perspective view of a multi-board spacer extending from the insulator board in accordance with the first embodiment of the present invention.

FIG. 5 is a perspective view of an insulator board in accordance with a second embodiment of the present invention.

DETAILED DESCRIPTION

Figure 1:
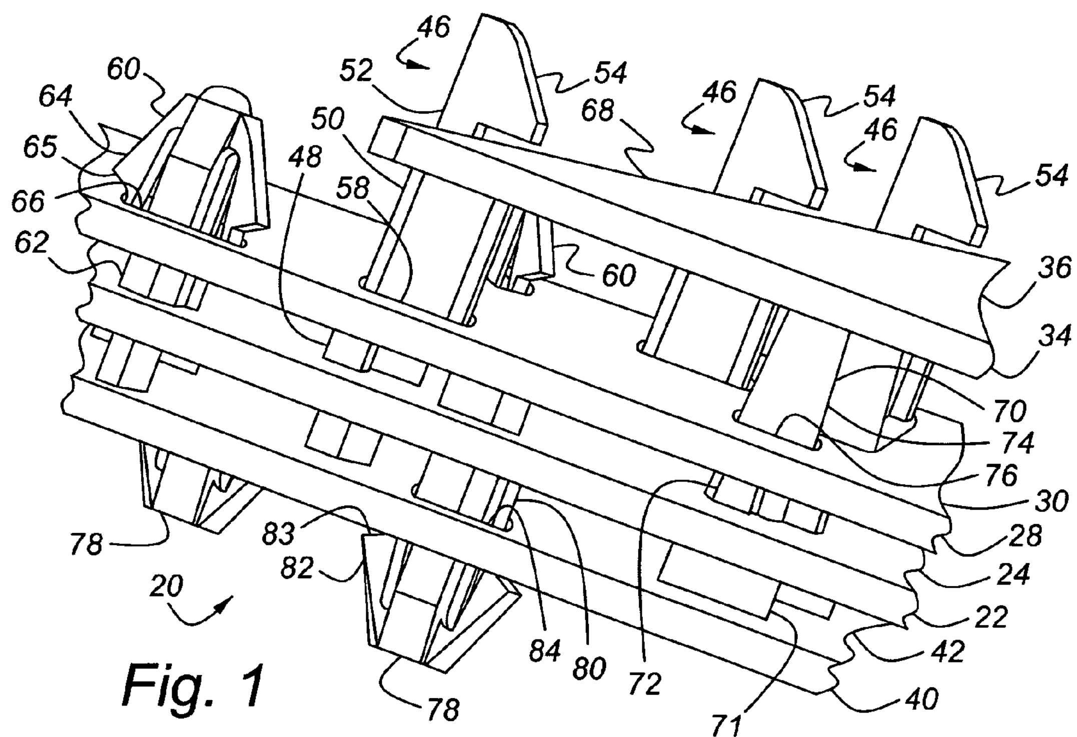
FIG. 1 is a perspective view of a portion of a circuit board assembly in accordance with a first embodiment of the present invention.

FIGS. 1–4 illustrate a circuit board assembly 20 that includes an insulator board (plate) 22, which has a first side 24 and a second side 26, a low current circuit board 28, which has a first side 30 and a second side 32, a first high current circuit board 34, which has a first side 36 and a second side 38, and a second high current circuit board 40, which has a first side 42 and a second side 44. The insulator board 22, low current circuit board 28, first high current circuit board 34 and second high current circuit board 42 may be printed circuit boards having conventional electronic components (not shown) and printed wiring (not shown) thereon. Alternatively, the insulator board 22 may be just a plate that creates an insulating layer between the low current circuit board 28 and the second high current circuit board 40. Also, while certain boards are referred to as high current or low current, this is merely an example, and any of the boards may be high or low current depending upon the particular application.

The insulator board 22 has a series of multi-board clips 46 extending from its first side 24. Preferably, the multi-board clips 46 are integral with the insulator board 22. Integral, as used herein, means that the clips 46 are formed as part of the insulator board 22 rather than being separate components that are assembled to the board 22. Each multi-board clip 46 may include a short set of spacer blocks 48 that each extend a first height above the first side 24, forming a short set of support surfaces 49; a long set of spacer blocks 50, adjacent to the short set of spacer blocks 48, that extend a second height above the first side 24 and form a long set of support surfaces 51, with the second height being greater than the first height; and a securing flange 52, which extends farther still from the first side 24 and includes a barb 54 on its end that has an engagement surface 56 that is a third height above the first side 24, with the third height being greater than the second height. The distance between the long support surfaces 51 and the engagement surface 56 is at least as large as the thickness of the first high current circuit board 34.

In addition to the height differences, the locations of the various components of the multi-board clips 46 also contribute to the multi-functional capabilities of these clips 46. Each of the long sets of spacer blocks 50 are preferably a pair of spacer blocks, one each on either side of their respective securing flange 52. Further, each of the long sets of spacers blocks 50 are preferably a pair of spacer blocks, one each between its respective securing flange 52 and a respective one of its corresponding short set of spacer blocks 48.

The low current circuit board 28 has mounting holes 58, with each hole 58 fitting around its corresponding long set of spacer blocks 50 and barb 54 such that the second side 32 comes to rest on the short support surfaces 49 of the corresponding short set of spacer blocks 48. Various means may be employed to hold the low current circuit board 28 against the short support surfaces 49. For example, the insulator board 22 may include one or more of a more conventional two board clip 60, which may include spacer blocks 62 and barbs 64, which have engagement surfaces 65 a fourth height above the first side 24, extending through a hole 66 in the low current circuit board 28, which rests on the spacer blocks 62. Preferably, such two board clips 60 are also integral with the insulator board 22. Other examples may include one or more additional barbs (not shown) extending from the long set of spacer blocks 50 just above the short support surfaces 49, or a mounting hole 58 that creates an interference fit with the sides of the long set of spacer blocks 50 when the low current circuit board 28 is in contact with the short support surfaces 49.

After installation of the low current circuit board 28, the first high current circuit board 34 can be installed. The edge 68 of the first high current circuit board 34 snaps past the barbs 54, with the second side 38 coming to rest on the long support surfaces 51 of the long sets of spacer blocks 50. Alternatively, the first high current circuit board 34 may have one or more holes (not shown) that snap past the barbs 54 and come to rest on the long support surfaces 51 of the long sets of spacer blocks 50. Thus, with a single set of multi-board clips 46 extending from one side of the insulator board 22, two additional circuit boards 28, 34 may be retained in spaced relation to each other.

In order to add further support and maintain the spacing of the low and high current boards 28, 34, while not necessarily securing one board to the other, multi-board spacers 70—extending from the first side 24 of the insulator board 22—may be employed. Preferably, these multi-board spacers 70 are also integral with the insulator board 22. The multi-board spacers 70 may each have a set of short central spacer blocks 72 surrounding a long central spacer block 74. The short central spacer blocks 72 each extend outward from the first side 24 of the insulator board 22 the first height to a short central support surface 73, and the long central spacer blocks 74 each extend outward from the first side 24 the second height to a long central support surface 75. The low current circuit boards 28 have mounting holes 76 that align with and are large enough to fit over the long central spacer blocks 74, but small enough that the second side 32 of the low current circuit board 28 will come to rest on the short central support surfaces 73. The second side 38 of the first high current circuit board 34, when installed, will rest on the long central support surfaces 75 of the long central spacer blocks 74. The multi-board spacers 70 may also include lower spacer blocks 71 that extend downward from the insulator board 22 a sufficient distance to provide support to the second high current circuit board 40. In this way, both the low current circuit board 28, the first high current circuit board 34, and the second high current circuit board 40 can have additional support mid-board.

Figure 2:
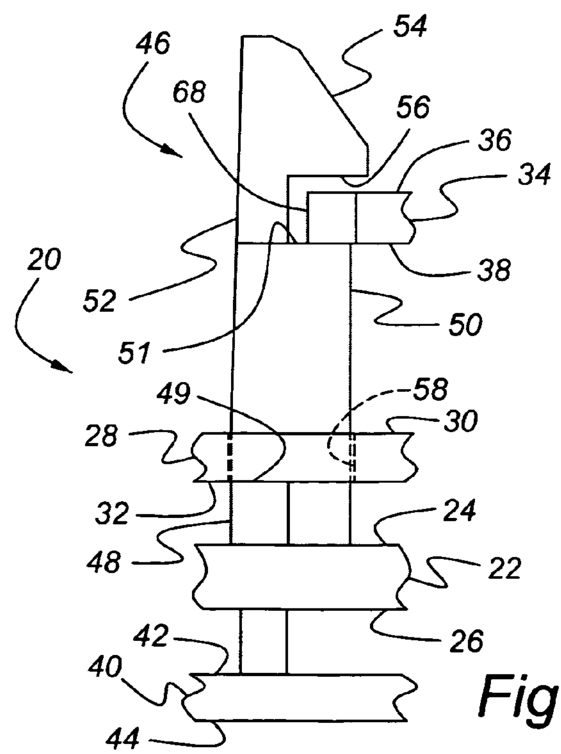
FIG. 2 is an elevation view of a portion of the assembly of FIG. 1.
Figure 6:
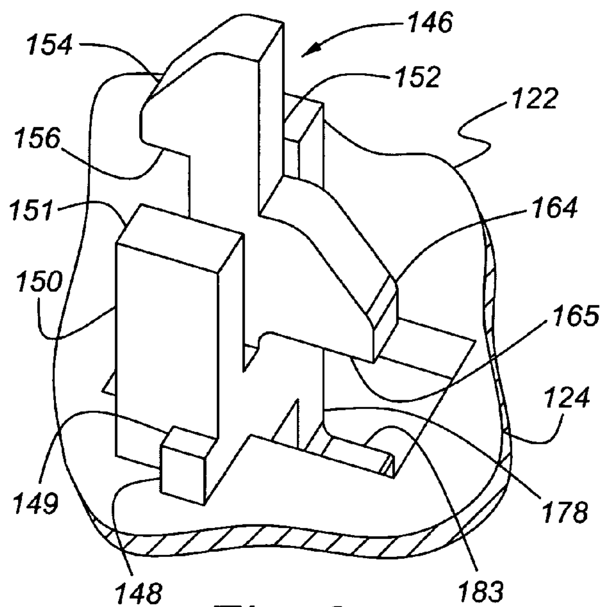
FIG. 6 is a perspective view of a multi-board clip extending from the insulator board in accordance with the second embodiment of the present invention.
Figure 7:
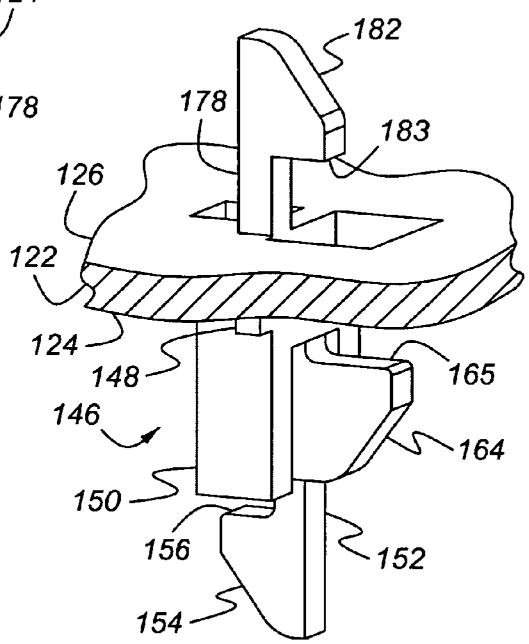
FIG. 7 is a perspective view of a multi-board clip similar to FIG. 6, but showing the clip from a different perspective.
Figure 8:
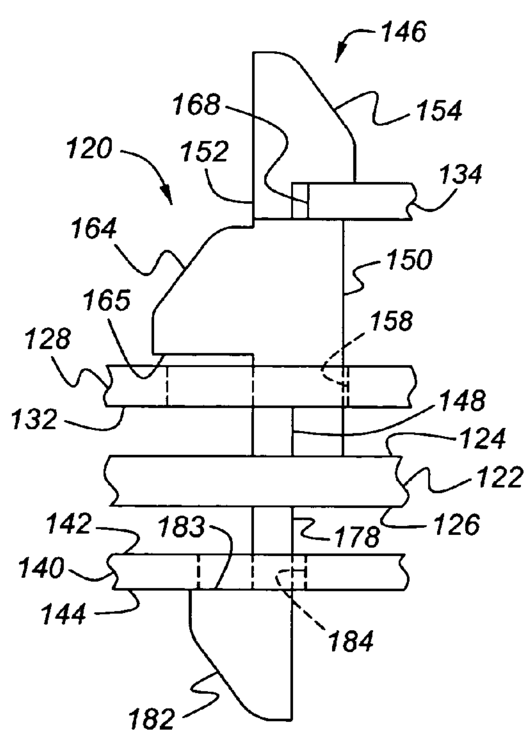
FIG. 8 is an elevation view similar to FIG. 2, but illustrating the second embodiment of the present invention.

The insulator board 22 may also have additional, more conventional two board clips 78 extending from its second side 26, which may include spacer blocks 80 and barbs 82, which have engagement surfaces 83 a first height below the second side 26, extending through a hole 84 in the second high current circuit board 40, which rests under the spacer blocks 80. Preferably, these two board clips 78 are integral with the insulator board 22. These two board clips 78, then, will retain the second high current circuit board 40 in spaced relation to the insulator board 22, (as can be seen in FIGS. 1 and 2). In this way, the four boards can be retained in spaced relation to each other, without the need for separate clips and assemblies, and with only one of the boards having clips extending therefrom. Alternatively, the insulator board 22 may employ multi-board clips (not shown) extending from its second side 26 instead of or in addition to the two board clips 78. This would allow for the option of a fifth board (not shown) to be added to the circuit board assembly below the second high current circuit board 40, if so desired.

The terms "above," "below," "on," and "under" as employed herein are only with reference to the relative location of the components as shown in the figures in order to aid in describing the invention. Accordingly, the components can of course be oriented in any manner desired without departing from the spirit or scope of the invention.

FIGS. 5–8 illustrate a second embodiment of the present invention, which is similar to the first, but with the multi-board clips securing the four boards in spaced relation without the need for separate two board clips. For purposes of this description, elements in the second embodiment that have counterpart elements in the first embodiment have been identified by similar reference numerals, except they are 100-series element numbers.

Again, an insulator board 122 is part of the circuit board assembly 120, and can be just a plate or may be a printed circuit board like the other boards. The insulator board 122 includes a series of multi-board clips 146 extending therefrom that are preferably integral with the insulator board 122.

Similar to the first embodiment, the multi-board clips each include—extending from the first side 124—a short set of spacer blocks 148, with short support surfaces 149, a long set of spacer blocks 150, with long support surfaces 151, and a securing flange 152, with a barb 154 and engagement surface 156.

Each of the multi-board clips 146 may also include a second barb 164, extending from the securing flange 152 on an opposed surface and in the opposite direction from the barb 154. Each second barb 164 has an engagement surface 165 that extends a height above the first side 124 that is sufficiently higher than the short support surfaces 149 to secure the low current circuit board 128 therebetween. In this way, the multi-board clips 146 can space and retain both the low current circuit board 128 and the first high current circuit board 134, with or without any other types of clips.

In addition, each of the multi-board clips 146 may include a second securing flange 178 extending from the second side 126 of the insulator board 122. Each second securing flange 178 includes a barb 182 extending therefrom that has an engagement surface 183, which is spaced below the second side 126 of the insulator board 122 a height that will space the second high current board 140 below the insulator board 122 a desired distance. In this way, the multi-board clips 146 can secure and space apart four boards, without the need for other types of clips. Moreover, with the multi-board clips 146 being integral with the insulator board 122, the number of separate parts required to produce the circuit board assembly 120 may be reduced. As an alternative, the multi-board clips 146 may also include a set of short spacer blocks (not shown) extending below the second side 126 of the insulator board 122 to assure the spacing is maintained—although, other types of spacers extending from the second side 126 of the insulator board 122 or the first side 142 of the second high current circuit board 140 may be employed instead.

The assembly of the boards into the circuit board assembly 120 is similar to the first embodiment. The low current board 128 includes mounting holes 158, with each large enough to fit around the corresponding barbs 154 and long spacer blocks 150 and snap past the second barbs 164 so that second side 132 of low current board 128 rests on short support surfaces 149. Edges 168, or alternatively holes (not shown), of the first high current circuit board 134 snap past the barbs 154 and rests on the long support surfaces 151, secured and supported above the low current board 128. On the underside of the insulator board 122, mounting holes 184 in the second high current board 140 snap over barbs 182, allowing the second side 144 to rest on the engagement surfaces 183. Thus, four boards are secured and spaced from one another with integral clips extending from only the one board 122.

While certain embodiments of the present invention have been described in detail, those familiar with the art to which this invention relates will recognize various alternative designs and embodiments for practicing the invention as defined by the following claims.

What is claimed is:

1. A circuit board retainer and support apparatus comprising:

a first board including a first side and an opposed second side;

a first multi-board clip extending from the first side, with the first multi-board clip including a first short spacer block having a short support surface located a first height above the first side, a first long spacer block having a long support surface located a second height above the first side that is greater than the first height, and a first securing flange, having a first barb with an engagement surface that is a third height above the first side that is greater than the second height, and with the first long spacer block being located adjacent to the first securing flange and the first short spacer block being located adjacent to the first long spacer block and farther from the first securing flange than the first long spacer block; and a two board clip extending from the first side and spaced from the first multi-board clip, with the two board clip including a short spacer block having a two board support surface located at the first height above the first side and a barb having an engagement surface that is a fourth height above the first side that is greater than the first height.

2. The circuit board retainer and support apparatus of claim 1 further including a second multi-board clip extending from the first side, with the second multi-board clip including a second short spacer block having a second short support surface located at the first height, a second long spacer block having a second long support surface located at the second height, and a second securing flange, having a second barb with a second engagement surface that is at the third height, and with the second long spacer block being located adjacent to the second securing flange and the second short spacer block being located adjacent to the second long spacer block and farther from the second securing flange than the second long spacer block.

3. The circuit board retainer and support apparatus of claim 1 wherein the first multi-board clip further has a second barb, extending from the first securing flange in an opposed direction to the first barb, and including a second engagement surface located the fourth height above the first side that is greater than the first height and less than the second height.

4. The circuit board retainer and support apparatus of claim 3 wherein the first multi-board clip further has a second securing flange, extending from the second side in opposed relation to the first securing flange, and including a third barb with an engagement surface that is a first height below the second side.

5. The circuit board retainer and support apparatus of claim 1 wherein the first multi-board clip further has a second securing flange, extending from the second side in opposed relation to the first securing flange, and including a second barb with an engagement surface that is a first height below the second side.

6. The circuit board retainer and support apparatus of claim 1 further including a second two board clip extending from the second side and including a spacer block and a barb with an engagement surface located a first height below the second side that is greater than the height of the spacer block.

7. The circuit board retainer and support apparatus of claim 1 wherein the first multi-board clip includes a second short spacer block having a second short support surface located at the first height, and a second long spacer block having a second long support surface located at the second height, with the second long spacer block being located adjacent to the first securing flange and opposed to the first long spacer block relative to the first securing flange, and the second short spacer block being located adjacent to the second long spacer block and farther from the first securing flange than the second long spacer block.

8. A circuit board assembly comprising:

a first board including a first side and an opposed second side;

a first multi-board clip extending from the first side of the first board, with the first multi-board clip including a first short spacer block having a short support surface located a first height above the first side of the first board, a first long spacer block having a long support surface located a second height above the first side of the first board that is greater than the first height, and a first securing flange, having a first barb with an engagement surface that is a third height above the first side of the first board that is greater than the second height, and with the first long spacer block being located adjacent to the first securing flange and the first short spacer block being located adjacent to the first long spacer block and farther from the first securing flange than the first long spacer block;

a first circuit board including a first side, an opposed second side that faces the first side of the first board, and a mounting hole sized to receive the first long spacer block and the first securing flange therethrough while not receiving the first short spacer block therethrough such that the second side of the first circuit board rests against the short support surface; and a second circuit board including a first side, an opposed second side that faces the first side of the first circuit board and rests against the long support surface, and a mounting portion engaged with the engagement surface of the first barb.

9. The circuit board assembly of claim 8 wherein the first board is an insulator plate.

10. The circuit board assembly of claim 9 wherein the first board is a third circuit board.

11. The circuit board assembly of claim 8 wherein the first multi-board clip further has a second barb, extending from the first securing flange in an opposed direction to the first barb, and including a second engagement surface located a fourth height above the first side that is greater than the first height and less than the second height.

12. The circuit board assembly of claim 11 wherein the first multi-board clip further has a second securing flange, extending from the second side in opposed relation to the first securing flange, and including a third barb with an engagement surface that is a first height below the second side.

13. The circuit board assembly of claim 8 wherein the first multi-board clip further has a second securing flange, extending from the second side in opposed relation to the first securing flange, and including a second barb with an engagement surface that is a first height below the second side.

14. The circuit board assembly of claim 8 further including a second multi-board clip extending from the first side of the first board, with the second multi-board clip including a second short spacer block having a second short support surface located at the first height, a second long spacer block having a second long support surface located at the second height, and a second securing flange, having a second barb with a second engagement surface that is at the third height, and with the second long spacer block being located adjacent to the second securing flange and the second short spacer block being located adjacent to the second long spacer block and farther from the second securing flange than the second long spacer block.

15. The circuit board assembly of claim 8 further including a multi-board spacer extending from the first side of the first board and spaced from the first multi-board clip, with the multi-board spacer including a central short spacer block having a central short support surface located the first height above the first side, and a central long spacer block having a central long support surface located the second height above the first side.

16. A circuit board retainer and support apparatus comprising:

a first board including a first side and an opposed second side; and a first multi-board clip extending from the first side, with the first multi-board clip including a first short spacer block having a short support surface located a first height above the first side, a first long spacer block having a long support surface located a second height above the first side that is greater than the first height, and a first securing flange, having a first barb with an engagement surface that is a third height above the first side that is greater than the second height, and with the first long spacer block being located adjacent to the first securing flange and the first short spacer block being located adjacent to the first long spacer block and farther from the first securing flange than the first long spacer block, and the first multi-board clip further including a second securing flange, extending from the second side in opposed relation to the first securing flange, and including a second barb with an engagement surface that is a first height below the second side.

17. The circuit board retainer and support apparatus of claim 16 wherein the first multi-board clip further has a second barb, extending from the first securing flange in an opposed direction to the first barb, and including a second engagement surface located a fourth height above the first side that is greater than the first height and less than the second height.

18. The circuit board retainer and support apparatus of claim 16 further including a two board clip extending from the second side and including a spacer block and a barb with an engagement surface located the first height below the second side that is greater than the height of the spacer block.

19. A circuit board retainer and support apparatus comprising:

a first board including a first side and an opposed second side;

a first multi-board clip extending from the first side, with the first multi-board clip including a first short spacer block having a short support surface located a first height above the first side, a first long spacer block having a long support surface located a second height above the first side that is greater than the first height, and a first securing flange, having a first barb with an engagement surface that is a third height above the first side that is greater than the second height, and with the first long spacer block being located adjacent to the first securing flange and the first short spacer block being located adjacent to the first long spacer block and farther from the first securing flange than the first long spacer block; and a two board clip extending from the second side and including a spacer block and a barb with an engagement surface located a first height below the second side that is greater than the height of the spacer block.

* * * * *